United States Patent
Suzuki et al.

(10) Patent No.: US 9,603,285 B2
(45) Date of Patent: Mar. 21, 2017

(54) COOLANT SUPPLY UNIT, COOLING UNIT, AND ELECTRONIC DEVICE

(71) Applicant: FUJITSU LIMITED, Kawasaki-shi, Kanagawa (JP)

(72) Inventors: Masumi Suzuki, Kawasaki (JP); Michimasa Aoki, Kawasaki (JP); Jie Wei, Hachioji (JP)

(73) Assignee: FUJITSU LIMITED, Kawasaki (JP)

( * ) Notice: Subject to any disclaimer, the term of this patent is extended or adjusted under 35 U.S.C. 154(b) by 787 days.

(21) Appl. No.: 13/953,838

(22) Filed: Jul. 30, 2013

(65) Prior Publication Data

US 2014/0071623 A1   Mar. 13, 2014

(30) Foreign Application Priority Data

Sep. 7, 2012 (JP) ................................ 2012-197930

(51) Int. Cl.
*F04B 9/117* (2006.01)
*H05K 7/20* (2006.01)
(Continued)

(52) U.S. Cl.
CPC .......... *H05K 7/20272* (2013.01); *F04B 9/117* (2013.01); *F04B 23/04* (2013.01);
(Continued)

(58) Field of Classification Search
CPC  F04B 9/117; F04B 9/137; F04B 23/04; F04B 23/06; F04D 13/12; F04D 13/14;
(Continued)

(56) References Cited

U.S. PATENT DOCUMENTS 5,265,434 A * 11/1993 Alsenz ................. F25B 49/022
  62/117
5,325,884 A *  7/1994 Mirel et al. .......... G05D 7/0652
  137/110
(Continued)

FOREIGN PATENT DOCUMENTS

JP  06-104357 A  4/1994
JP  07-142654 A  6/1995
(Continued)

OTHER PUBLICATIONS

Notice of Reasons for Rejection dated Mar. 29, 2016 corresponding to Japanese Patent Application No. 2012-197930, and English translation thereof.
(Continued)

*Primary Examiner* — Allen Flanigan
(74) *Attorney, Agent, or Firm* — Squire Patton Boggs (US) LLP

(57) ABSTRACT

A coolant supply unit includes a plurality of pumps, a casing that includes a coolant inlet port, a plurality of branch ports that respectively convey coolant to the plurality of pumps, a plurality of flow merging ports through which the coolant from the plurality of pumps merges, and a coolant outlet port; and a separating wall that is provided inside the casing and that separates the inside of the casing into a distribution chamber that is in communication with the inlet port and the branch ports, and a flow merging chamber that is in communication with the flow merging ports and the outlet port.

14 Claims, 17 Drawing Sheets

(51) Int. Cl.
*F04D 13/12* (2006.01)
*F04B 23/04* (2006.01)

(52) U.S. Cl.
CPC ......... *F04D 13/12* (2013.01); *H05K 7/20636* (2013.01); *Y10T 137/86163* (2015.04); *Y10T 137/87265* (2015.04)

(58) Field of Classification Search
CPC ............ H05K 7/20772; H05K 7/20272; H01L 23/473
USPC ....... 417/3, 4, 62, 423.5; 165/80.4; 361/699, 361/700
See application file for complete search history.

(56) References Cited

U.S. PATENT DOCUMENTS

| | | | |
|---|---|---|---|
| 5,406,807 A | 4/1995 | Ashiwake et al. | |
| 8,500,419 B2* | 8/2013 | Scarsdale | F04B 35/04 |
| | | | 166/335 |
| 2004/0028532 A1* | 2/2004 | Beyer et al. | F04B 35/045 |
| | | | 417/62 |
| 2005/0122684 A1* | 6/2005 | Chu et al. | H05K 7/2079 |
| | | | 361/698 |
| 2005/0244280 A1* | 11/2005 | Malone et al. | F04B 19/006 |
| | | | 417/286 |
| 2012/0244015 A1* | 9/2012 | Benson et al. | F04D 29/601 |
| | | | 417/53 |
| 2013/0020058 A1* | 1/2013 | Suzuki et al. | G06F 1/20 |
| | | | 165/104.31 |

FOREIGN PATENT DOCUMENTS

| | | |
|---|---|---|
| JP | 2004-501307 A | 1/2004 |
| JP | 2005-315255 A | 11/2005 |

OTHER PUBLICATIONS

Japanese Office Action corresponding to Japanese Patent Application No. 2012-197930, dated Oct. 18, 2016. X.

* cited by examiner

COOLANT SUPPLY UNIT, COOLING UNIT, AND ELECTRONIC DEVICE

CROSS-REFERENCE TO RELATED APPLICATION

This application is based on and claims the benefit of priority of the prior Japanese Patent Application No. 2012-197930, filed on Sep. 7, 2012, the entire contents of which are incorporated herein by reference.

FIELD

The embodiments discussed herein are related to a coolant supply unit, a cooling unit and an electronic device.

BACKGROUND

Structures are sometimes employed wherein coolant for cooling a heat emitting component such as an electronic component inside an electronic device is circulated by a pump.

It is preferable to increase the coolant flow rate in order to raise cooling performance. It is also preferable to increase the coolant flow rate when plural heat emitting components are cooled. Technology is known in which, for example, plural pumps are coupled to liquid coolant loop tubing.

Related Patent Documents

Japanese Laid-Open Patent Publication No. 2005-315255

SUMMARY

According to an aspect of the embodiments, a coolant supply unit includes: plural pumps; a distribution chamber portion that includes a coolant inlet port and plural branch ports that respectively convey the coolant to the plural pumps; and a flow merging chamber portion that includes plural flow merging ports where the coolant from the plural pumps merges and a coolant outlet port, and that is integrated together with the distribution chamber portion to configure a casing.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Detailed explanation follows regarding a first exemplary embodiment, with reference to the drawings.

Figure 1:
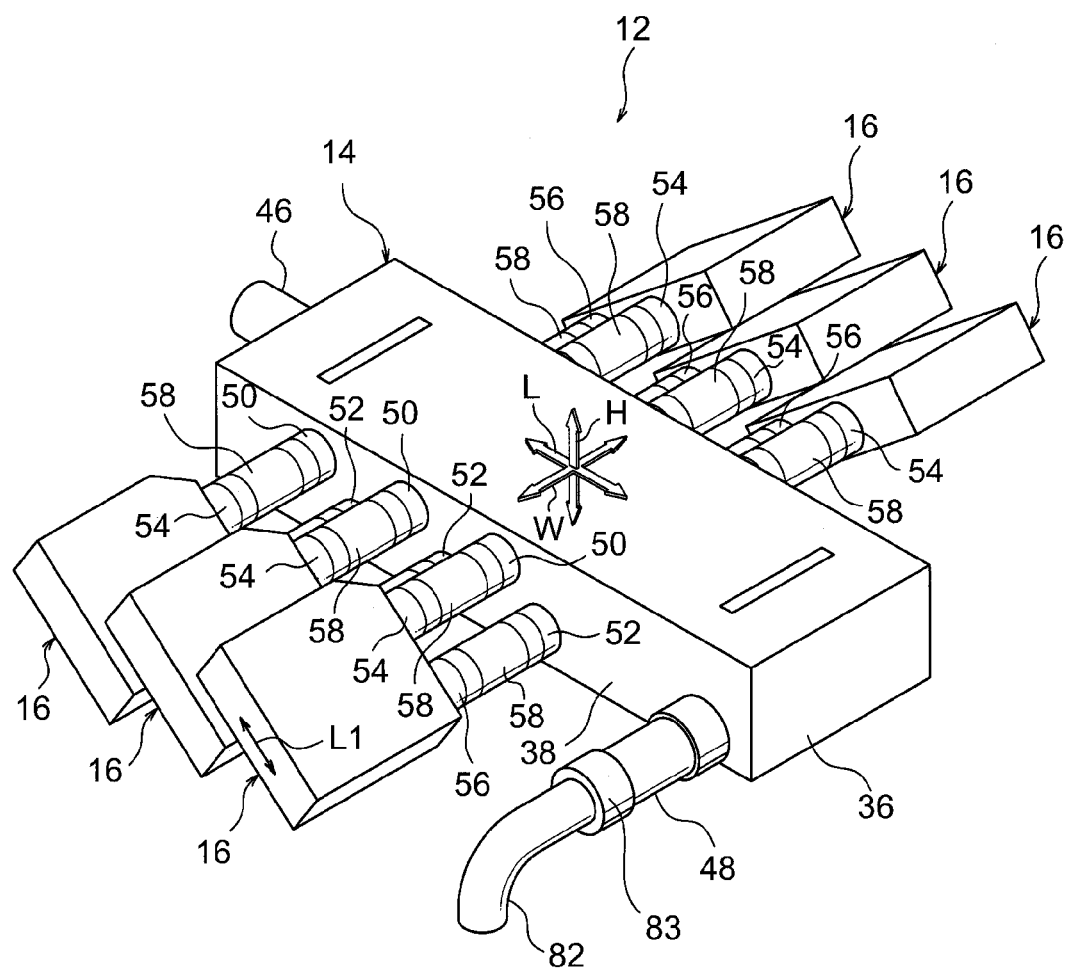
FIG. 1 is a perspective view illustrating a coolant supply unit of a first exemplary embodiment.
Figure 2:
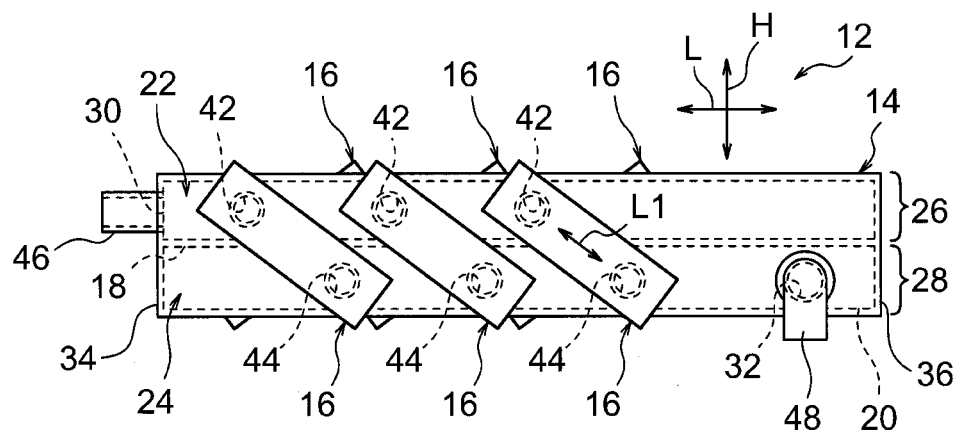
FIG. 2 is a side view illustrating a coolant supply unit of the first exemplary embodiment.
Figure 3:
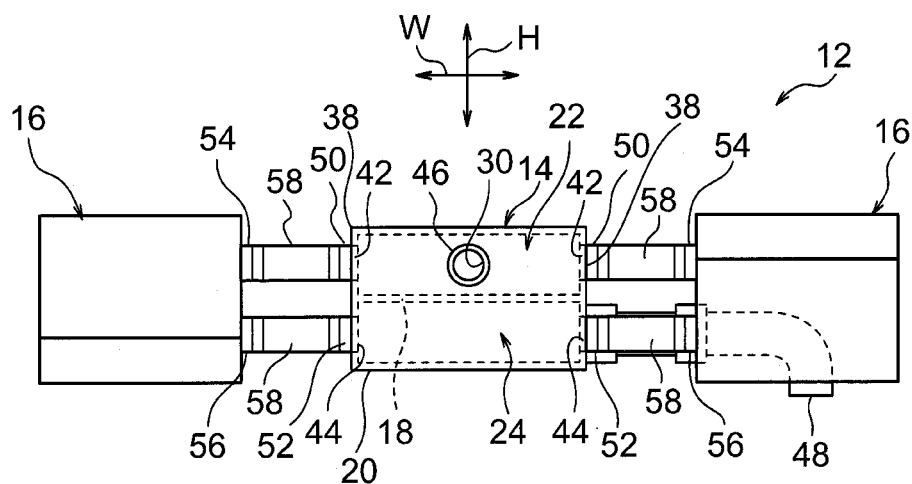
FIG. 3 is a face-on view illustrating a coolant supply unit of the first exemplary embodiment.

As illustrated in FIG. 1 to FIG. 3, a coolant supply unit 12 of the first exemplary embodiment includes substantially rectangular box shaped casing 14, and plural (six in the illustrated example) pumps 16 connected to the casing 14.

In the following explanation, the length direction, width direction and height direction of the casing 14 are respectively indicated by the arrows L, W, and H. Note that the length direction, width direction and height direction do not limit the actual installation orientation of the coolant supply unit 12.

As illustrated in FIG. 2 and FIG. 3, a separating wall 18 that partitions the inside of the casing 14 into two chambers is provided extending along the casing 14 length direction and width direction inside the casing 14. In the present exemplary embodiment, the separating wall 18 is disposed parallel to a bottom wall 20 at a casing 14 height direction intermediate position. The separating wall 18 separates the inside of the casing 14 into a distribution chamber 22 (the chamber on the upper side in the illustrated example) and a flow merging chamber 24 (the chamber on the lower side in the illustrated example). In other words, the casing 14 has a structure into which a distribution chamber portion 26 that includes the distribution chamber 22, and a flow merging chamber portion 28 that includes the flow merging chamber 24, are integrated together by the separating wall 18 that serves as a common portion. Note that in the present exemplary embodiment, the distribution chamber 22 is positioned at the upper side of the flow merging chamber 24, however the distribution chamber 22 may also be positioned at the lower side of the flow merging chamber 24.

A coolant inlet port 30 is provided to a one end wall 34 (a wall on one length direction end portion side) of the casing 14. The one end wall 34 of the casing 14 is further provided with a tank side connection tube 46 that is in communication with the distribution chamber 22 through the inlet port 30.

A coolant outlet port 32 is provided to a side wall 38 of the casing 14 at a position close to an other end wall 36 (a wall on the other length direction end portion side). The side wall 38 of the casing 14 is further provided with a heat receiving member side connection tube 48 that is in communication with the flow merging chamber 24 through the outlet port 32.

Plural (in the illustrated example, three on one side wall 38, giving a total of six for both side walls) branch ports 42 are provided to both side walls 38 of the casing 14 at positions to the upper side of the separating wall 18, namely at positions corresponding to the distribution chamber 22. In the present exemplary embodiment, the plural branch ports 42 are provided at an equal separation in the casing 14 length direction. Pump side connection tubes 50 are provided to the side walls 38 of the casing 14, corresponding to the respective branch ports 42, and in communication with the distribution chamber 22 through the branch ports 42.

The same number of flow merging ports 44 as the number of branch ports 42 are provided to both side walls 38 of the casing 14 to the lower side of the separating wall 18, namely at positions corresponding with the branch ports 42. The flow merging ports 44 correspond one-for-one with the branch ports 42. In the present exemplary embodiment, the plural flow merging ports 44 are provided at equal separations (at the same separations as the branch ports 42) in the casing 14 length direction. Pump side connection tubes 52 are further provided to the side walls 38 of the casing 14, corresponding to the respective flow merging ports 44, and in communication with the flow merging chamber 24 through the flow merging ports 44.

In the present exemplary embodiment, the respective flow merging ports 44 are provided at positions displaced in the casing 14 length direction towards the one end wall 34 side, or towards the other end wall 36 side, with respect to the corresponding branch ports 42.

The plural pumps 16 are disposed at the sides of the casing 14. Each of the pumps 16 includes an inlet tube 54 and a discharge tube 56. Connection tubes 58 respectively connect the inlet tubes 54 to the pump side connection tubes 50, and the discharge tubes 56 to the pump side connection tubes 52. Coolant in the distribution chamber 22 can accordingly be first fed into the pumps 16, and then pressurized and conveyed towards the flow merging chamber 24 by the drive of the pumps 16.

In particular in the present exemplary embodiment, the corresponding branch ports 42 and flow merging ports 44 are provided at positions displaced from each other in the casing 14 length direction. In side view of the casing 14, a length direction L1 of the respective pumps 16 is accordingly inclined at a specific angle of inclination with respect to a length direction L of the casing 14.

Figure 4:
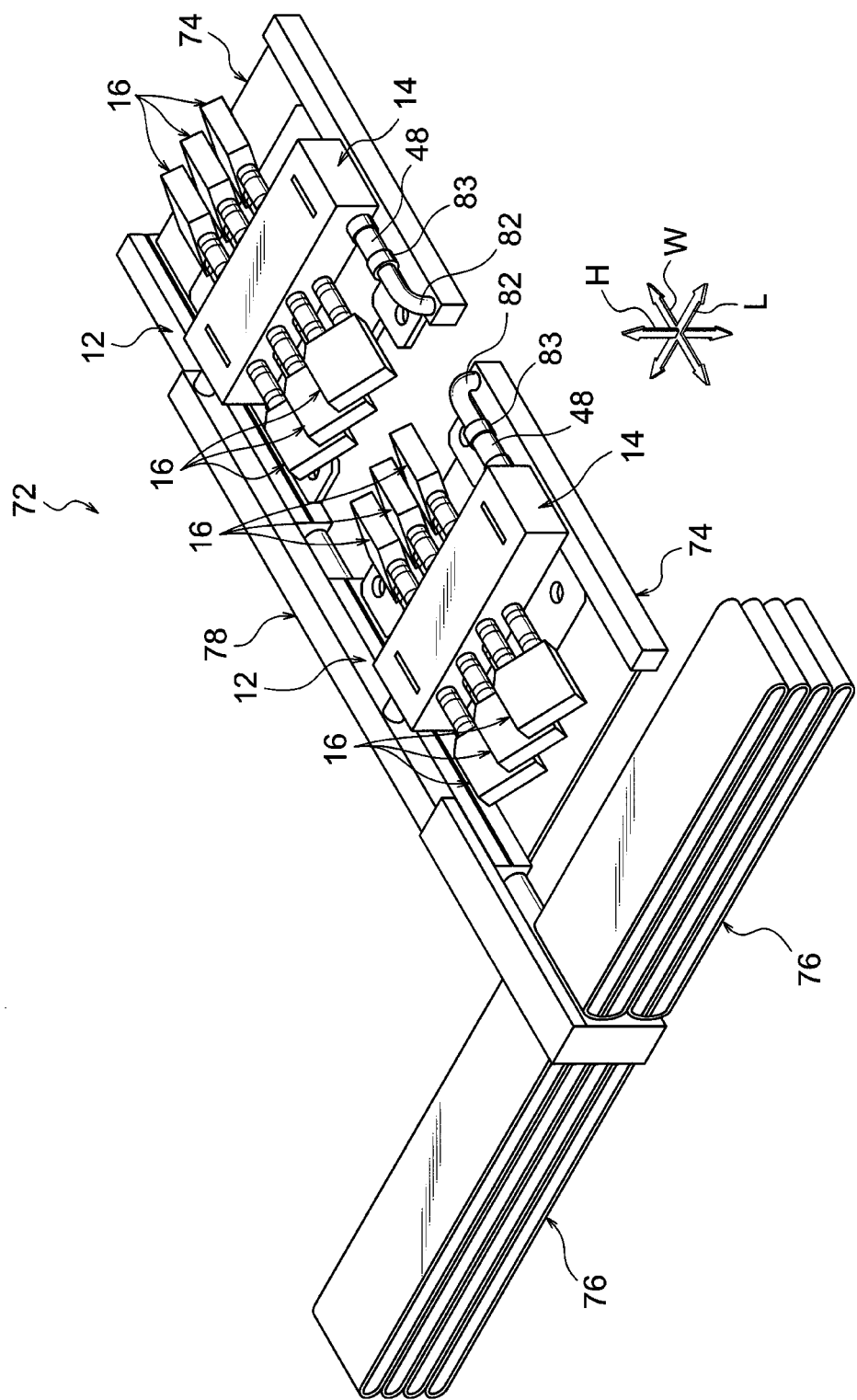
FIG. 4 is a perspective view illustrating a cooling unit of the first exemplary embodiment.
Figure 5:
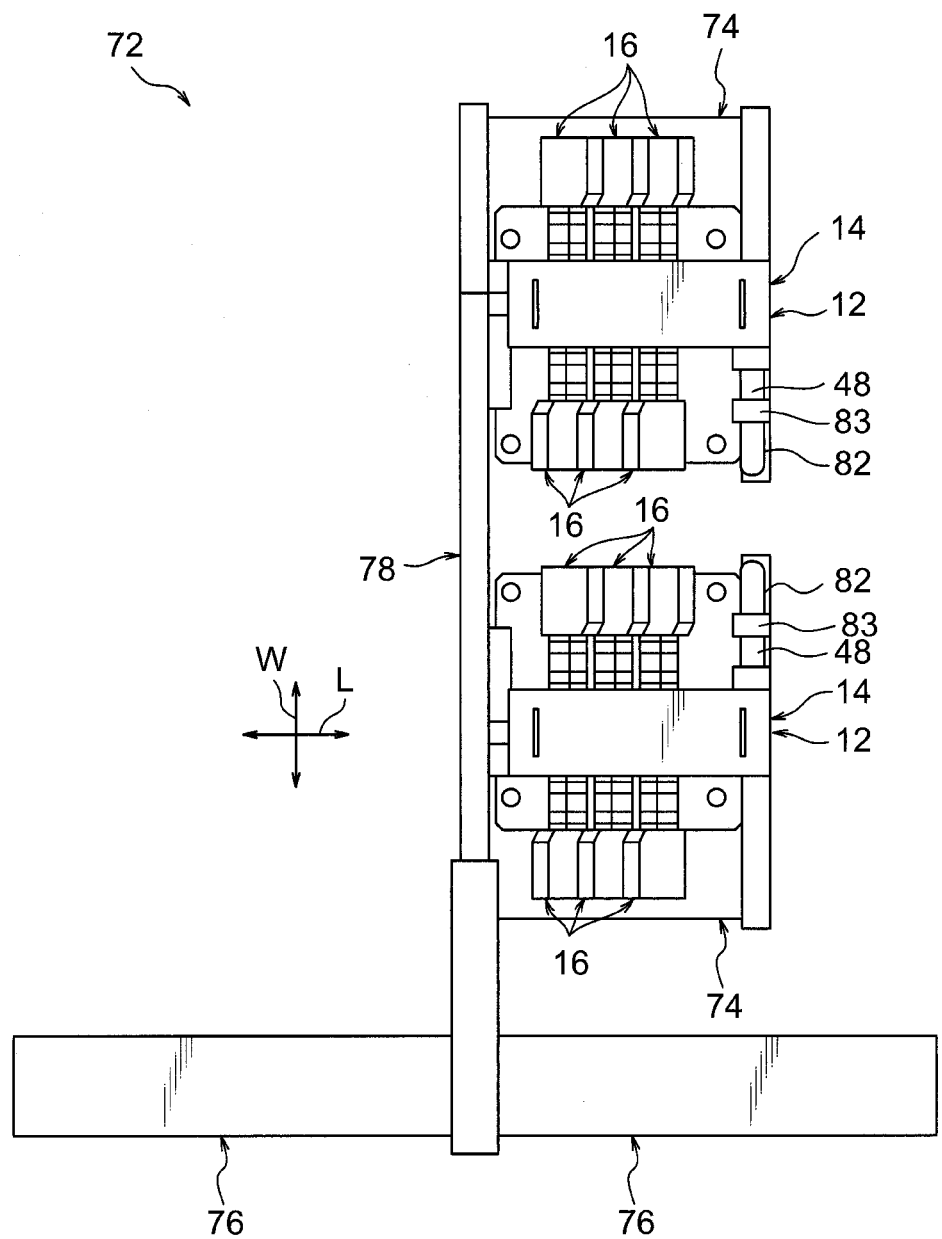
FIG. 5 is a plan view illustrating a cooling unit of the first exemplary embodiment.

As illustrated in FIG. 4 and FIG. 5, a cooling unit 72 of the present exemplary embodiment includes the coolant supply unit 12, a heat receiving member 74, a heat exchanger 76, and a tank 78. In the particular example illustrated in FIG. 4 and FIG. 5, plural (two) of the coolant supply units 12 are provided, however, configuration may be made with a single coolant supply unit 12, as in the example illustrated in FIG. 6.

Figure 6:
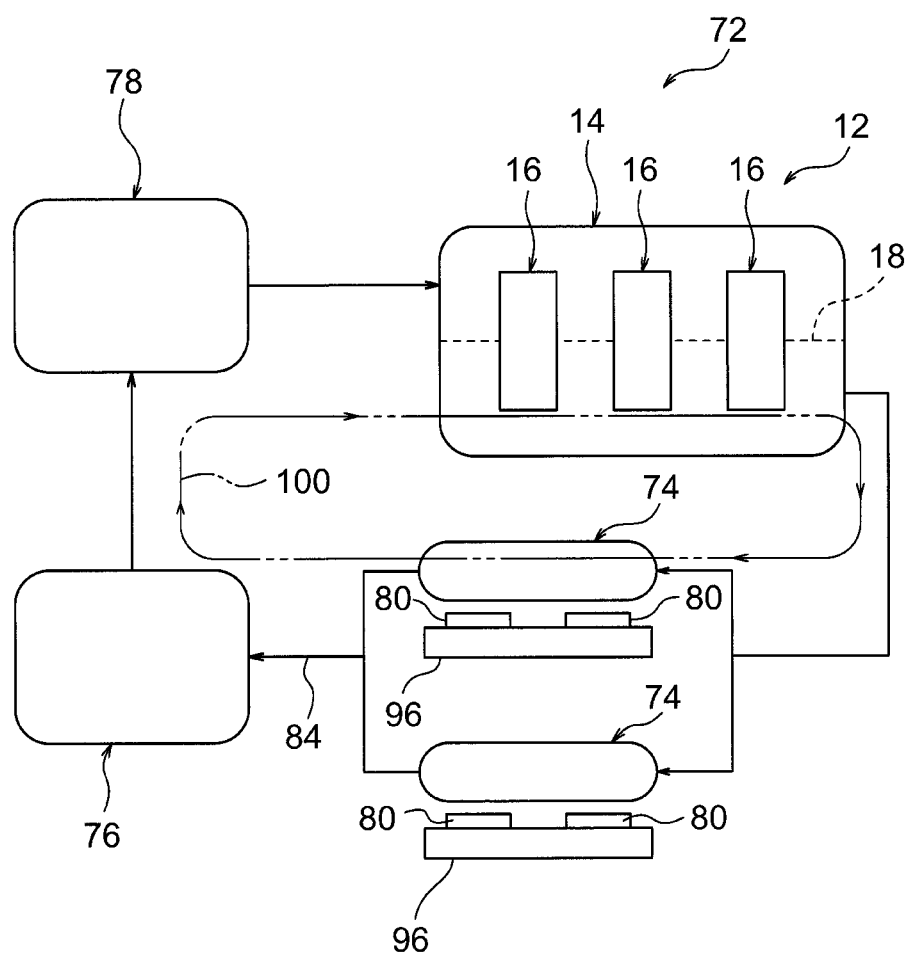
FIG. 6 is a block diagram illustrating a cooling unit of the first exemplary embodiment.

In the present exemplary embodiment, the heat receiving member 74 is formed in a substantially plate shape. Coolant is able to move inside the heat receiving member 74. As illustrated in FIG. 6, electronic components 80 and a power supply component, serving as examples of cooling target members, are disposed below the heat receiving member 74. In the particular example illustrated in FIG. 6, the heat receiving member 74 is positioned above the electronic components 80 that are mounted on a board 96.

A connection tube 82 connects the heat receiving member 74 to the outlet port 32 of the casing 14 through a clip 83 and the heat receiving member side connection tube 48. A connection tube 84 connects the heat receiving member 74 to an external member. Heat from the electronic components 80 (see FIG. 6) and the power supply component that are cooling target members is absorbed by the coolant when coolant supplied from the coolant supply unit 12 passes inside the heat receiving member 74, thereby cooling the cooling target members. The coolant with raised temperature due to the heat of the cooling target members is expelled through the connection tube 84 to the external member.

Note that the external member may be another heat receiving member, or may be the heat exchanger 76. However, construction is such that coolant that moves to another heat receiving member subsequently moves to the heat exchanger 76.

As illustrated in FIG. 4 and FIG. 5, the heat exchanger 76 is disposed with length direction matching the orientation of the casing 14 length direction (the arrow L direction) in plan view. The tank 78 that is connected to the heat exchanger 76 is disposed with length direction oriented intersecting (orthogonally in the illustrated example) with the heat exchanger 76 in plan view. Namely, as seen in plan view, the heat exchanger 76 and the casing 14 are parallel to each other, whilst both the heat exchanger 76 and the casing 14 are disposed at an orientation orthogonal to the tank 78. Moreover, at least one (three in the illustrated example) of the plural pumps 16 is disposed between the heat exchanger 76 and the casing 14 positioned adjacent thereto.

The heat exchanger 76 is an example of a cooling member, and cools the coolant with raised temperature in the heat receiving member 74. The cooling member is not limited to the heat exchanger 76 provided that the coolant can be cooled.

The tank 78 is an example of a storage member, and temporarily stores coolant that has been cooled in the heat exchanger 76 that is partway through being conveyed to the coolant supply unit 12. Note that a function to remove a gas component from the temporarily stored coolant may also be included.

Figure 7:
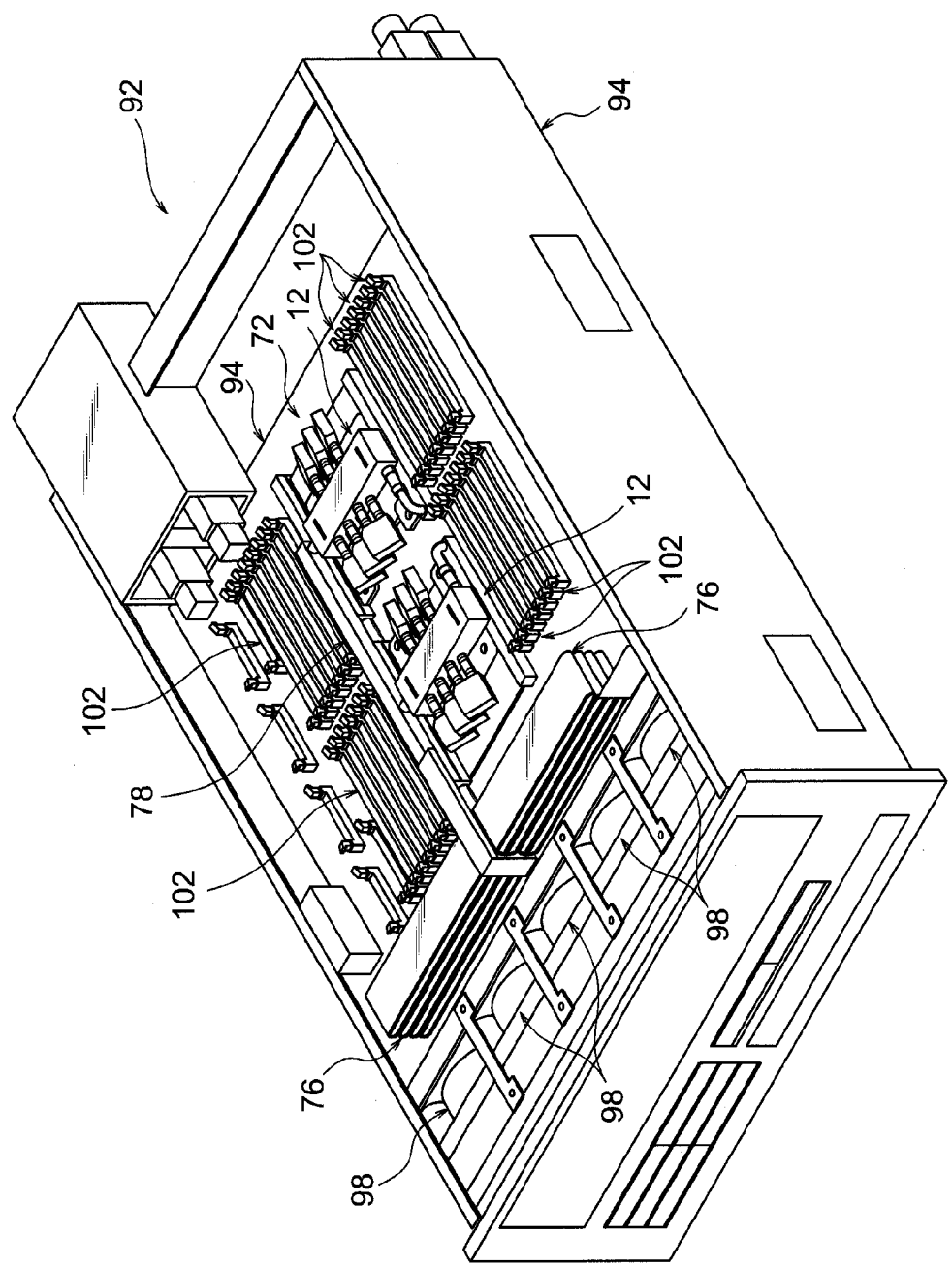
FIG. 7 is a perspective view illustrating an electronic device of the first exemplary embodiment.
Figure 8:
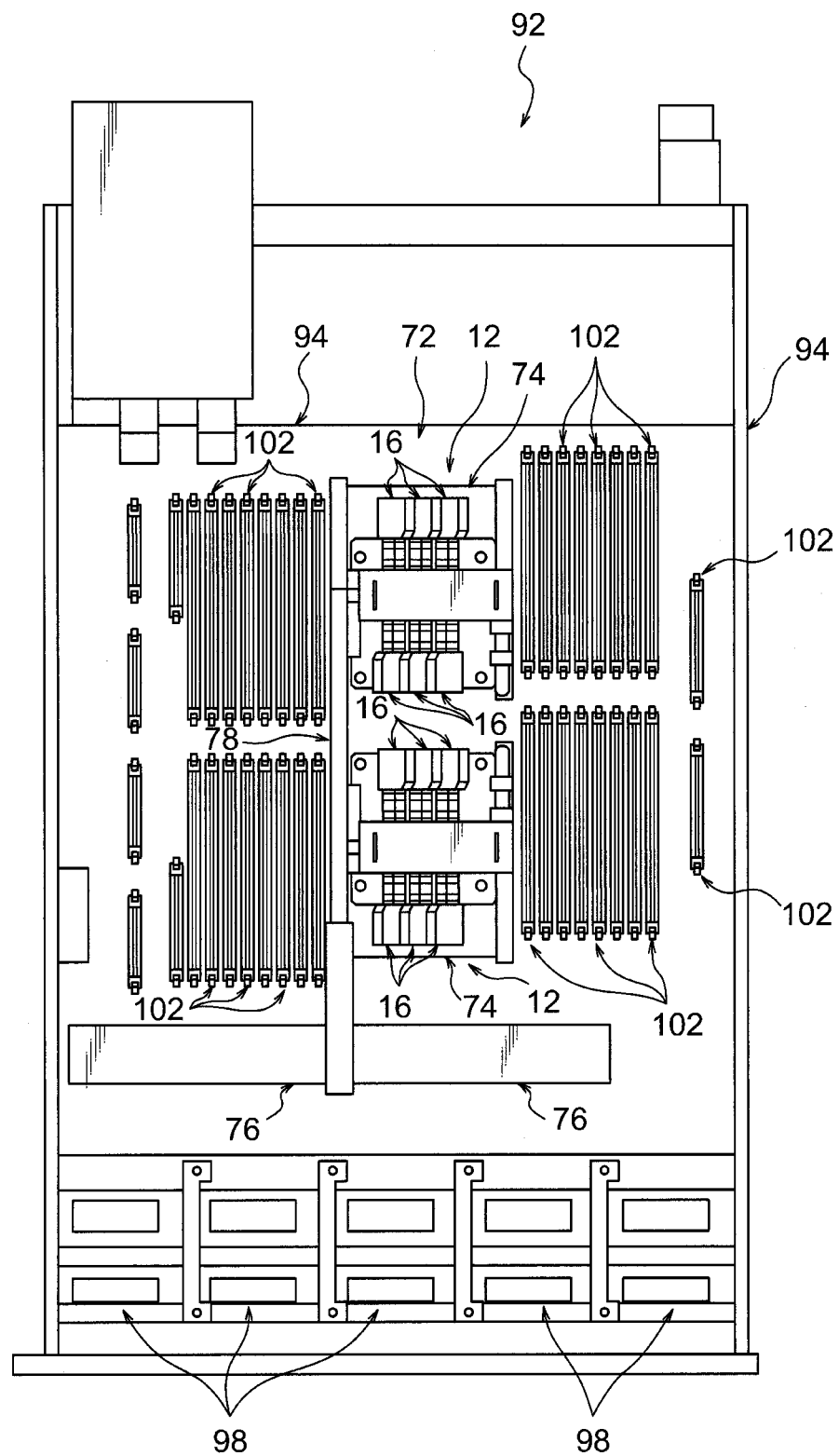
FIG. 8 is a plan view illustrating an electronic device of the first exemplary embodiment.

As illustrated in FIG. 7 and FIG. 8, an electronic device 92 of the present exemplary embodiment includes a substantially rectangular box shaped case 94. The board 96 is housed inside the case 94. The electronic components 80 (see FIG. 6) that are cooling target members are mounted on the board 96. The electronic components 80 are positioned beneath the heat receiving members 74.

Plural sockets 102 are mounted on the board 96. Integrated circuits, configuring for example memory, are attached to the respective sockets 102. The cooling unit 72 and the sockets 102 are disposed over the board 96 in shapes and positions that do not impinge on each other.

Cooling fans 98 that introduce cooling air from the outside are disposed inside the case 94. Cooling air introduced into the case 94 by the cooling fans 98 contacts and cools the heat exchanger 76 and the electronic components 80.

Next, explanation follows regarding operation of the coolant supply unit 12, the cooling unit 72 and the electronic device 92 of the present exemplary embodiment.

In the cooling unit 72 of the present exemplary embodiment, coolant is conveyed by drive of the plural pumps 16 from the flow merging chamber 24 of the coolant supply unit 12 to the heat receiving member 74. The electronic components 80 are cooled by the coolant in the heat receiving member 74 taking away the heat of the electronic components 80, and the temperature of the coolant rises. The coolant is then cooled in the heat exchanger 76, and stored in the tank 78. When the pumps 16 are driven continuously, the coolant is conveyed to the distribution chamber 22 of the coolant supply unit 12. The coolant then passes the pumps 16 and is conveyed out into the flow merging chamber 24. Namely, a coolant circulation loop 100 is configured wherein the coolant returns to the coolant supply unit 12 after passing from the coolant supply unit 12 through the heat receiving member 74, the heat exchanger 76 and the tank 78.

As can be seen from FIG. 1 to FIG. 3 and FIG. 6, the coolant supply unit 12 of the present exemplary embodiment includes plural of the pumps 16. A high coolant flow rate (the amount of coolant that can be supplied per time unit) can accordingly be secured even when the respective pumps 16 are small in comparison to a coolant supply unit 12 including a single pump. High cooling performance can moreover be maintained even when a large number of cooling target members (such as the electronic components 80 in the exemplary embodiment described above) are disposed in the electronic device 92, due to securing a high coolant flow rate.

In particular, the cooling unit 72 has high cooling performance of for example the electronic components 80 even when the amount of generated heat increases due to higher performance and higher density mounting of the electronic components 80 in the electronic device 92.

Moreover in the present exemplary embodiment, when a low coolant flow rate is sufficient, a portion of the plural pumps 16 may be driven instead of driving all of the plural pumps 16. Namely, since there are plural of the pumps 16, there are high degrees of freedom for varying the coolant flow rate, since cases in which a low coolant flow rate is sufficient can be easily accommodated by driving a portion of the pumps 16.

Energy consumption (drive power) can also be suppressed when a portion of the pumps 16 are driven compared to when all of the pumps 16 are driven. Since there are plural of the pumps 16 in the present exemplary embodiment, even when for example the performance of a portion of the pumps 16 drops, this drop in performance can be compensated for by the other pumps 16.

Note that for example a single large pump and an increased total amount of coolant inside the coolant circulation loop might be considered in order to secure a high coolant flow rate. However, were such a configuration to be adopted, not only would the pump increase in size, but the capacity of the tank would also increase, resulting in a larger cooling unit. There would also be low degrees of freedom for varying the coolant flow rate, since there is only a single pump. Moreover, the coolant supply performance of the overall cooling unit would drop with a drop in the performance of the pump.

Figure 9:
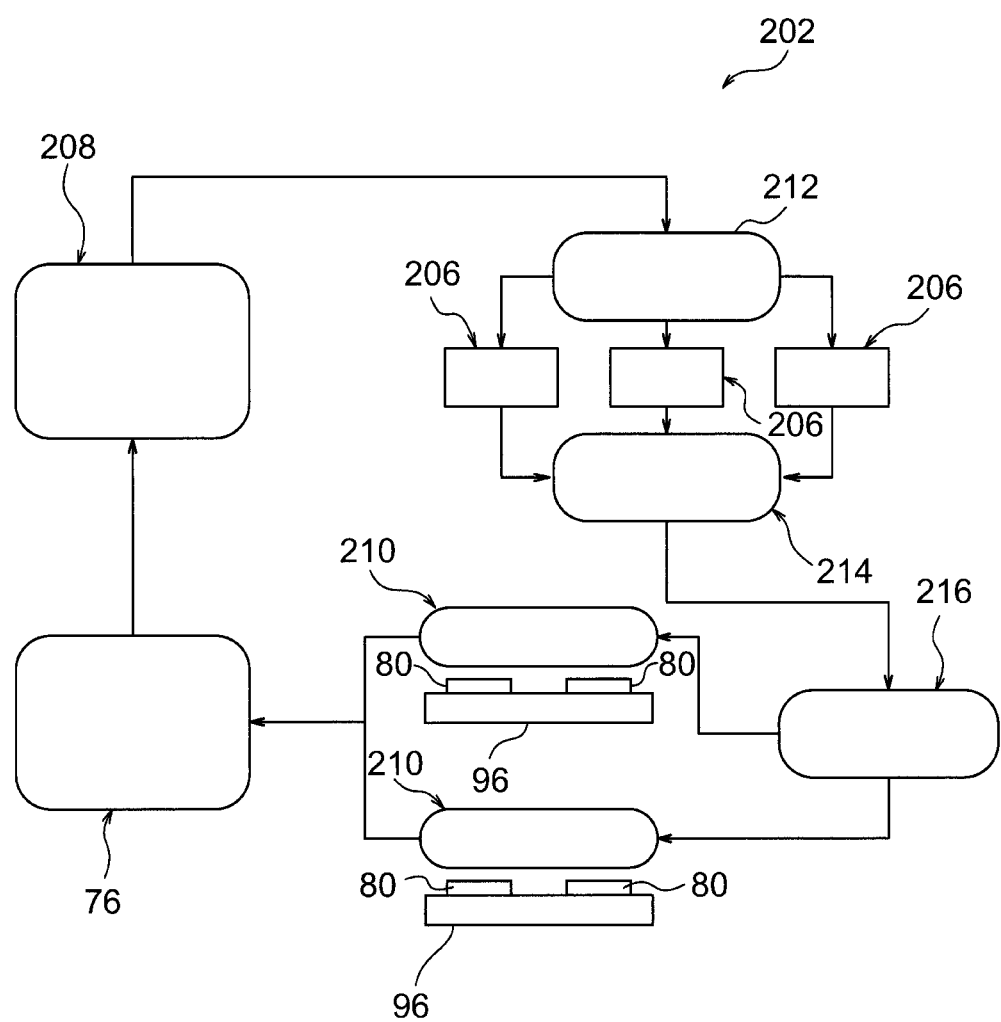
FIG. 9 is a block diagram illustrating a cooling unit of a comparative example.

FIG. 9 illustrates a cooling unit 202 of a comparative example. The cooling unit 202 of the comparative example does not include the coolant supply unit 12 of the above exemplary embodiment, and is merely provided with plural pumps 206. Note that in FIG. 9, elements similar to those illustrated in FIG. 6 are allocated the same reference numerals.

In the cooling unit 202, a tank 208 is disposed on the coolant circulation direction upstream side of the plural pumps 206. Heat receiving members 210 are disposed on the coolant circulation direction downstream side of the plural pumps 206. Multi-branched tubes 212 are provided between the tank 208 and the plural pumps 206, splitting the coolant flow path from the tank 208 to the respective pumps 206. A flow merging tube 214 that merges the coolant conveyed out from the respective pumps 206, as well as for example multi-branched tubes 216 that distribute the coolant to the plural heat receiving members 210, are provided between the pumps 206 and the heat receiving members 210. Namely, the cooling unit 202 of the comparative example comprises a complicated structure of multi-branched tubes and flow merging tubes, leading to concerns regarding increase in size of the cooling unit 202.

However, in the cooling unit 72 of the present exemplary embodiment, the distribution chamber portion 26 and the flow merging chamber portion 28 are integrated together in the coolant supply unit 12. In other words, the separating wall 18 provided inside the single casing 14 separates the inside of the casing 14 into the distribution chamber 22 and the flow merging chamber 24. The cooling unit 72 of the present exemplary embodiment accordingly does not comprise multi-branched tubes or flow merging tubes such as in the comparative example. The cooling unit 72 of the present exemplary embodiment is therefore simpler in structure that the comparative example, and can be made more compact. The electronic device 92 provided with the cooling unit 72 of the present exemplary embodiment is also simpler in structure than an electronic device provided with the cooling unit 202 of the comparative example, and can be made more compact.

By integrating together the distribution chamber portion 26 and the flow merging chamber portion 28 as described above, the coolant supply unit 12 can also be made more compact than a structure wherein the distribution chamber portion 26 and the flow merging chamber portion 28 are provided as separate bodies.

In particular, depending on the type of the electronic device 92, plural integrated circuits (for example a CPU) may be mounted on the board 96 as the electronic components 80. Such an electronic device 92 calls for high performance cooling of the plural integrated circuits. In the present exemplary embodiment, the coolant supply units 12 in the cooling unit 72 are added or removed as units, thereby adjusting the cooling performance with ease.

Coolant supply performance can also be varied by adding or removing coolant supply units 12 even when the number or placement of the electronic components (including for example the integrated circuits mentioned above) mounted on the board 96 is changed due to for example changes in the specification of the electronic device 92, thereby achieving a highly versatile cooling unit.

In plan view of the heat exchanger 76, the length direction of the heat exchanger 76 and the length direction of the tank 78 are inclined with respect to each other, and the casing 14 is parallel to the heat exchanger 76. The heat exchanger 76, the tank 78 and the casing 14 (the coolant supply unit 12) are accordingly efficiently disposed in a limited space, giving high space efficiency, in comparison for example to a structure wherein the casing 14 is disposed at an orientation inclined with respect to the heat exchanger 76 in plan view.

In particular, in the present exemplary embodiment at least one (three in the illustrated example) of the plural pumps 16 is disposed between the heat exchanger 76 and the casing 14 positioned adjacent thereto. Namely, space between the heat exchanger 76 and the casing 14 is used effectively, with the pumps 16 efficiently disposed, giving high space efficiency in this respect too. Note that in a structure wherein only one casing 14 is present, a structure is also possible wherein the casing 14 is disposed adjacent to the heat exchanger 76 with all of the pumps 16 disposed between the heat exchanger 76 and the casing 14 (with the pumps 16 disposed on only one width direction side of the casing 14).

Moreover, in the above exemplary embodiment, the heat receiving member 74 is disposed below the casing 14 and facing the casing 14. The casing 14 and the heat receiving member 74 overlap in plan view of the casing 14, with the heat receiving member 74 disposed in the vicinity of the casing 14. Space efficiency is accordingly higher than in a structure wherein the heat receiving member 74 is disposed at a position at a separation to the casing 14. Since the distance from the casing 14 to the heat receiving member 74 is greater in a structure wherein the heat receiving member 74 is at a separation to the casing 14, pumps having increase performance per pump would be used. In the present exemplary embodiment, there is no need to increase the performance of the pumps 16 since there is a short distance from the casing 14 to the heat receiving member 74, making it possible to achieve compact pumps 16.

Figure 10:
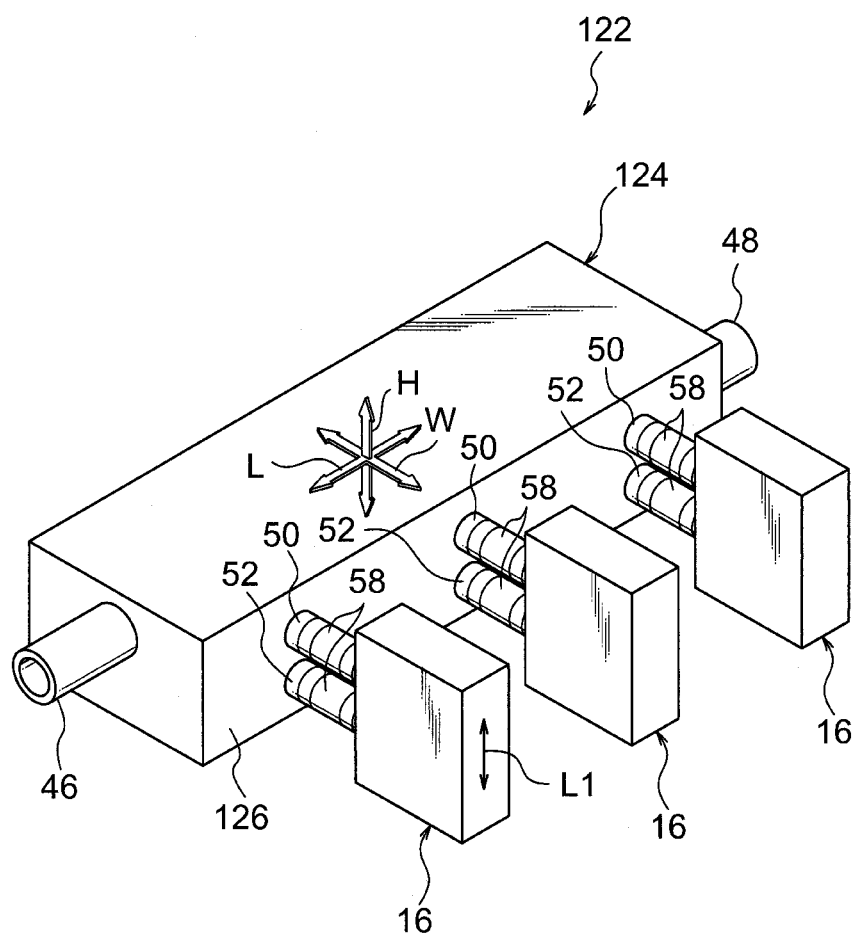
FIG. 10 is a perspective view illustrating a coolant supply unit of a second exemplary embodiment.
Figure 11:
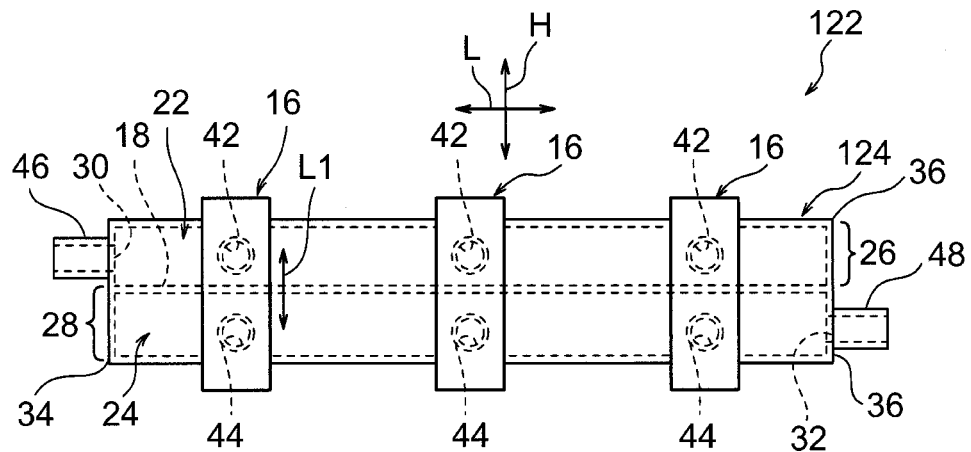
FIG. 11 is a side view illustrating a coolant supply unit of the second exemplary embodiment.
Figure 12:
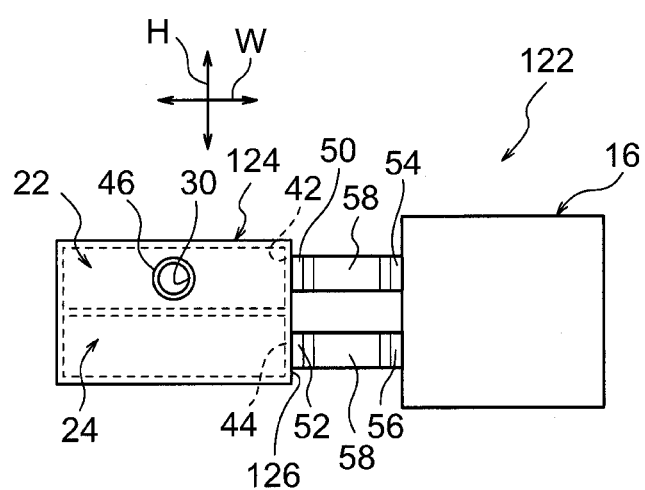
FIG. 12 is a face-on view illustrating a coolant supply unit of the second exemplary embodiment.

FIG. 10 to FIG. 12 illustrate a coolant supply unit 112 of a second exemplary embodiment. The cooling units in each of the following exemplary embodiments differ from the cooling unit 72 of the first exemplary embodiment (see FIG. 1 to FIG. 3) in the point that they each employ the coolant supply unit of the respective exemplary embodiment in place of the coolant supply unit 12. Images of the overall cooling units are accordingly omitted from illustration in the drawings. Moreover, elements and members in each of the exemplary embodiments that are similar to those of the first exemplary embodiment are allocated the same reference numerals and detailed explanation thereof is omitted. The electronic device 92 may be mounted with the cooling unit of any of the exemplary embodiments.

In the second exemplary embodiment, corresponding branch ports 42 and flow merging ports 44 are provided one above the other in a side wall 126 of a casing 124. As can be seen from FIG. 11, the length direction (the arrow L1 direction) of respective pumps 16 is orthogonal to the length direction (the arrow L direction) of the casing 124 in side view of the casing 124.

In a coolant supply unit 122 of the second exemplary embodiment, the separation between plural pumps 16 is shorter than in the coolant supply unit 12 of the first exemplary embodiment, enabling the casing 124 to be shortened in the length direction. Note that in the second exemplary embodiment, a distribution chamber 22 is positioned to the upper side of a flow merging chamber 24, however the distribution chamber 22 may be positioned below the flow merging chamber 24.

Figure 13:
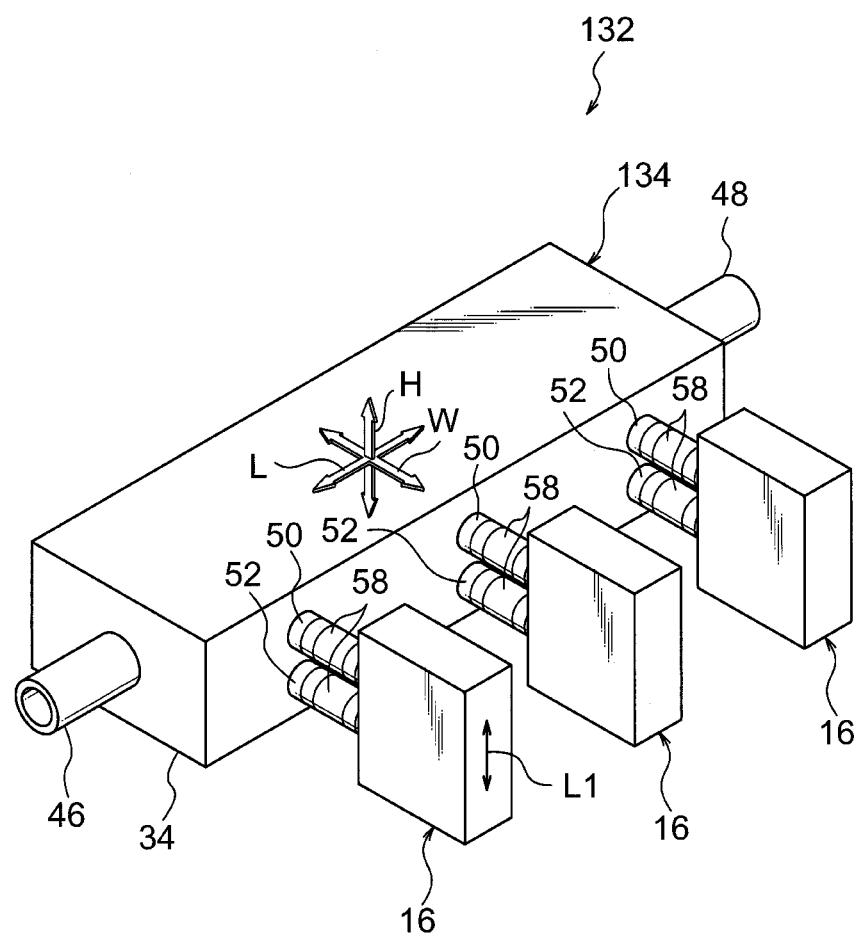
FIG. 13 is a perspective view illustrating a coolant supply unit of a third exemplary embodiment.
Figure 14:
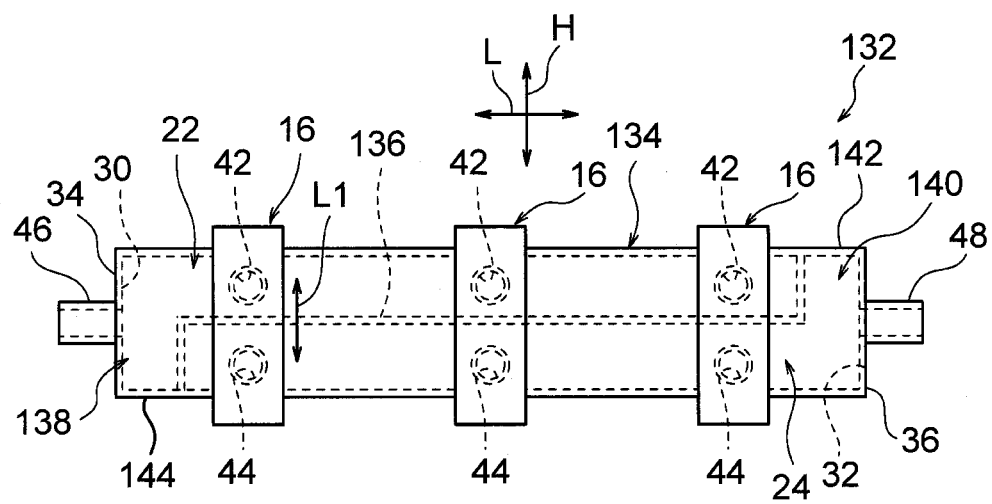
FIG. 14 is a side view illustrating a coolant supply unit of the third exemplary embodiment.
Figure 15:
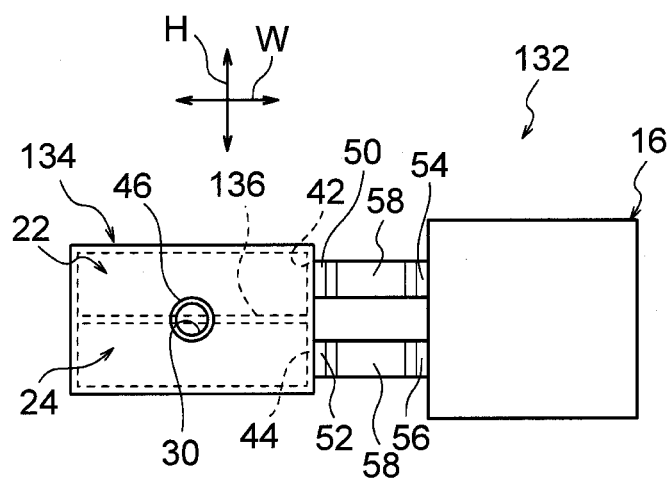
FIG. 15 is a face-on view illustrating a coolant supply unit of the third exemplary embodiment.

FIG. 13 to FIG. 15 illustrate a coolant supply unit 132 of a third exemplary embodiment. In the third exemplary embodiment, the shape of a casing 134 is substantially the same as that of the casing 124 of the second exemplary embodiment, however the shape of a separating wall 136 differs to that of the separating wall 18 of the first exemplary embodiment.

Namely, on a one end wall 34 side, the separating wall 136 of the third exemplary embodiment is bent downwards to reach a lower wall 144 so as to provide an enlarged distribution chamber 138 where a distribution chamber 22 is locally widened downwards. The enlarged distribution chamber 138 is an example of a first enlarged portion. On another end wall 36 side, the separating wall 136 is bent upwards to reach an upper wall 142 so as to provide an enlarged flow merging chamber 140 where a flow merging chamber 24 is locally widened upwards. The enlarged flow merging chamber 140 is an example of a second enlarged portion.

In the third exemplary embodiment, the enlarged distribution chamber 138 is enlarged to encompass the entire height direction of the casing 14 at the one end wall 34 side, accordingly giving a high degree of freedom for positioning an inlet port 30 in the height direction. The enlarged flow merging chamber 140 is also enlarged to encompass the entire height direction of the casing 14 at the other end wall 36 side, accordingly giving a high degree of freedom for positioning an outlet port 32 in the height direction.

Figure 16:
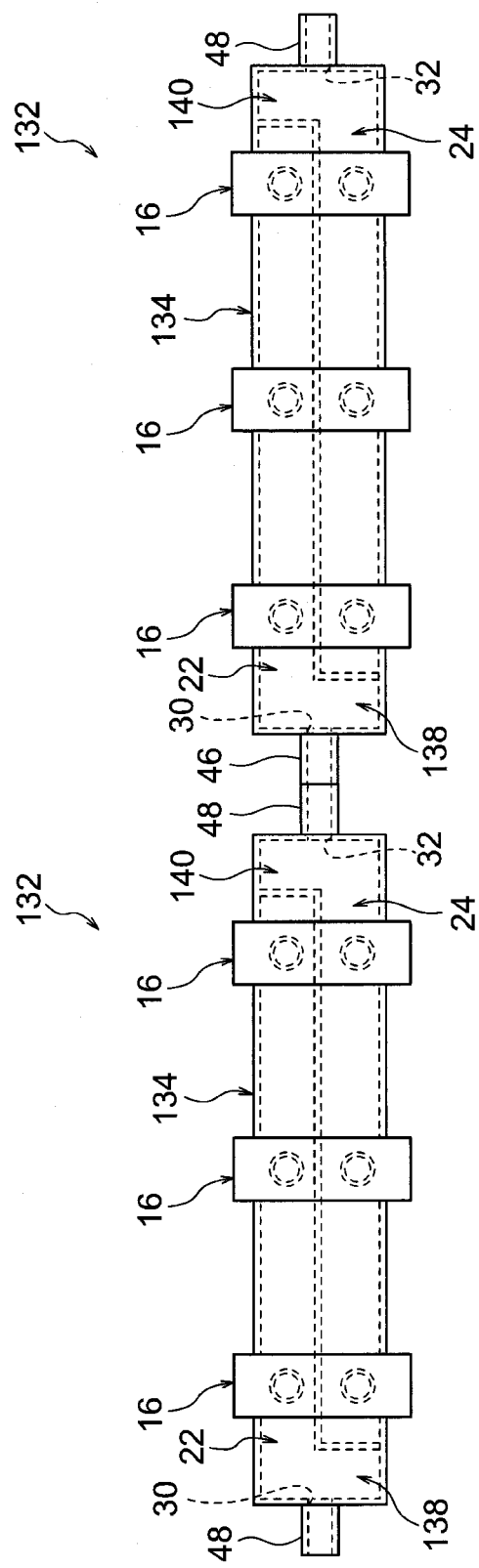
FIG. 16 is a side view illustrating plural coolant supply units of the third exemplary embodiment in a state connected together in a row.

As in the example illustrated in FIG. 16, the height of the inlet port 30 and the height of the outlet port 32 may be made the same as each other. By making the inlet port 30 and the outlet port 32 the same height as each other, as illustrated in FIG. 16, connection is performed easily when plural of the coolant supply units 132 are connected together in series. Installation is also easy during installation of the cooling unit provided with plural of the connected coolant supply units 132 to the electronic device 92 (see FIG. 7 and FIG. 8).

Note that in a structure wherein plural of the coolant supply units are provided to a single cooling unit, the coolant supply units may be connected together in series as described above, or may be connected together in parallel. Moreover in the third exemplary embodiment, the positions of the distribution chamber 22 and the flow merging chamber 24 may be swapped over.

Figure 17:
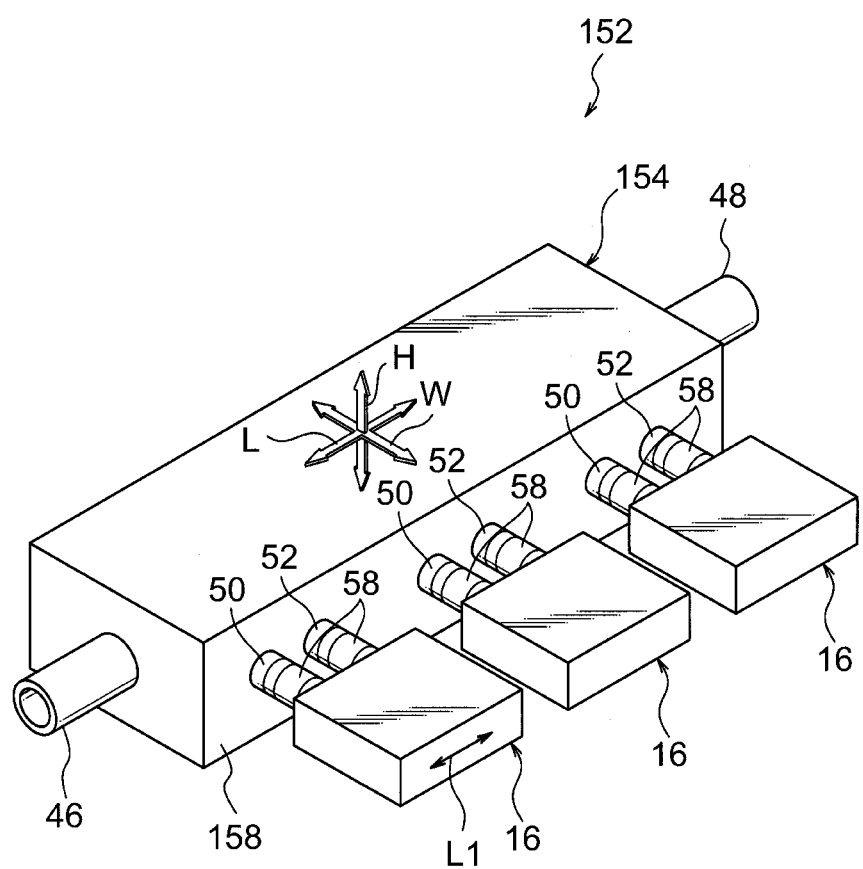
FIG. 17 is a perspective view illustrating a coolant supply unit of a fourth exemplary embodiment.
Figure 18:
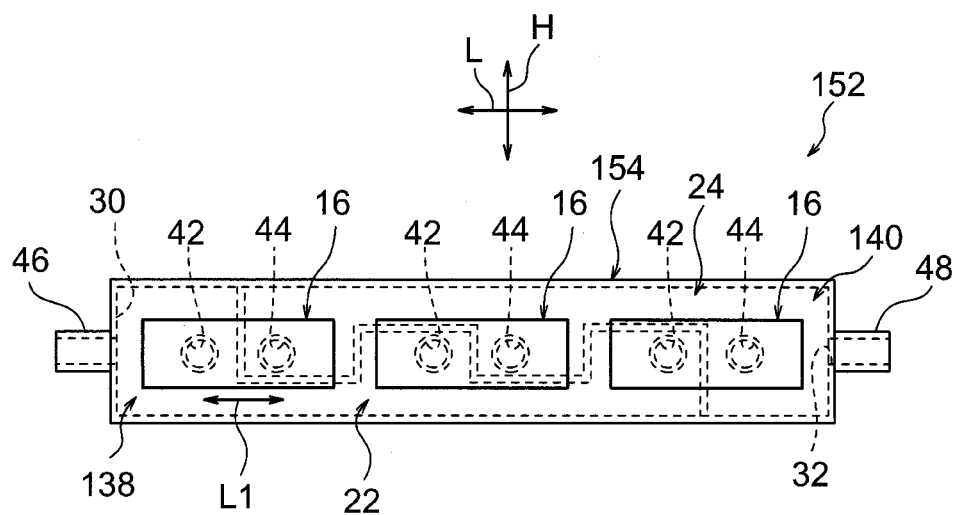
FIG. 18 is a side view illustrating a coolant supply unit of the fourth exemplary embodiment.
Figure 19:
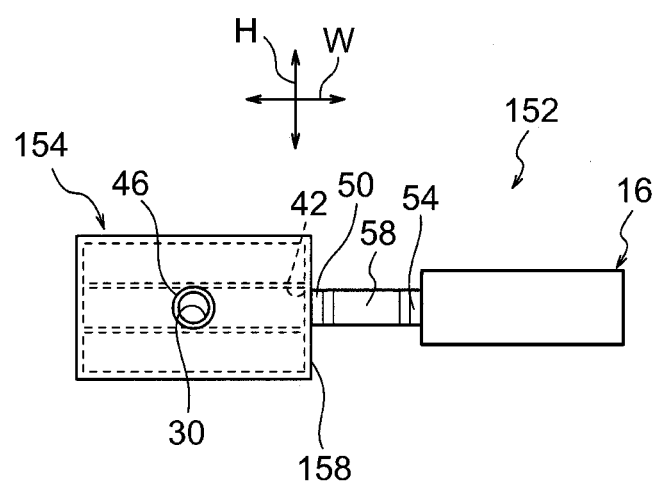
FIG. 19 is a face-on view illustrating a coolant supply unit of the fourth exemplary embodiment.

FIG. 17 to FIG. 19 illustrate a coolant supply unit 152 of a fourth exemplary embodiment. In the fourth exemplary embodiment, a side wall 158 of a casing 154 is alternately provided with branch ports 42 and flow merging ports 44 in a row along the casing 154 length direction (the arrow L direction). The length direction of the casing 154 (the arrow L direction) and the length direction of respective pumps 16 (the arrow L1 direction) are parallel to each other in side view of the casing 154.

As illustrated in FIG. 18, a separating wall 156 inside the casing 154 is bent at specific positions in side view. A distribution chamber 22 and a flow merging chamber 24 are respectively partitioned with a corrugated pattern such that the branch ports 42 open onto the distribution chamber 22, and the flow merging ports 44 open onto the flow merging chamber 24.

The length direction of the casing 154 and the length direction of the respective pumps 16 are thus parallel to each other in the coolant supply unit 152 of the fourth exemplary embodiment. The height of the casing 154 can accordingly be reduced in comparison to the coolant supply unit 12 of the first exemplary embodiment.

The length or height of the casing 154 can be reduced by adjusting the length direction of the casing 154 and the length direction of the pumps 16. In other words, for example the coolant supply unit 12 of the first exemplary embodiment has a structure that can be made shorter in the length direction in comparison to the coolant supply unit 152 of the fourth exemplary embodiment. Moreover, the coolant supply unit 12 of the first exemplary embodiment has a structure that can be reduced in height in comparison to the coolant supply unit 122 of the second exemplary embodiment.

Figure 20:
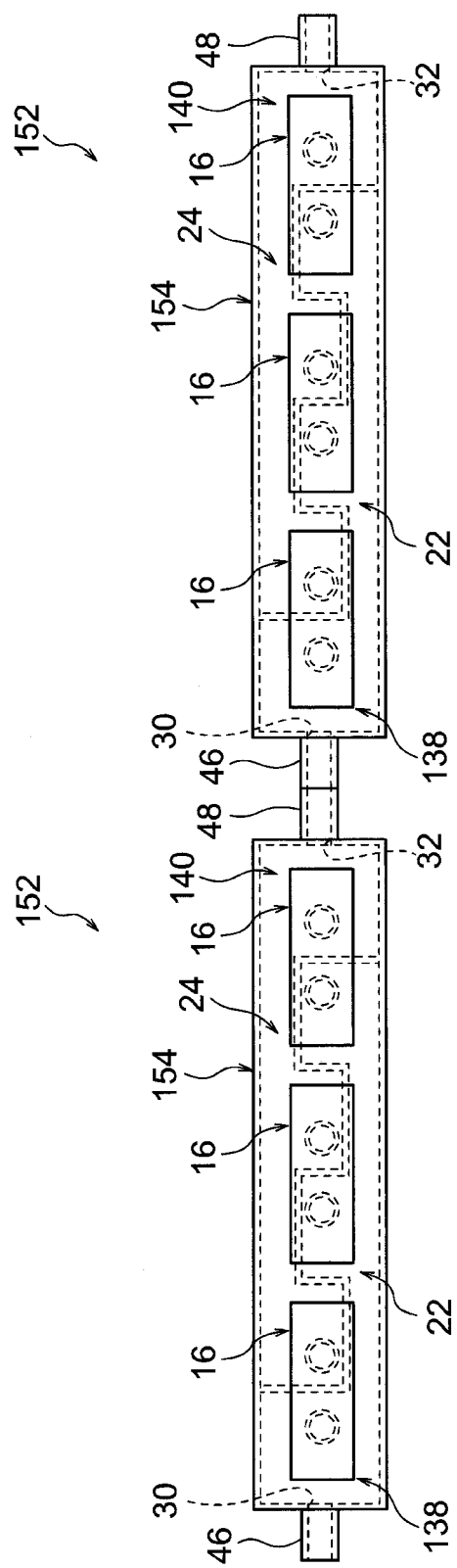
FIG. 20 is a side view illustrating plural coolant supply units of the fourth exemplary embodiment in a state connected together in a row.

Note that in the fourth exemplary embodiment, an enlarged distribution chamber 138 is enlarged to encompass the entire height direction of the casing 154 at a one end wall 34 side, and an enlarged flow merging chamber 140 is enlarged to encompass the entire height direction of the casing 154 at another end wall 36 side. There is accordingly a high degree of freedom in the height direction for positioning an inlet port 30 and an outlet port 32. For example, as in the example illustrated in FIG. 20, the height of the inlet port 30 and the height of the outlet port 32 may be made the same as each other, facilitating connection when plural of the coolant supply units 152 are connected together in series.

In the above explanation of the first exemplary embodiment an example has been given wherein plural of the pumps 16 are respectively disposed on both width direction sides of the casing 14. The number of pumps for a single casing 14 can accordingly be increased by providing the pumps 16 on both width direction sides of the casing 14.

Figure 21:
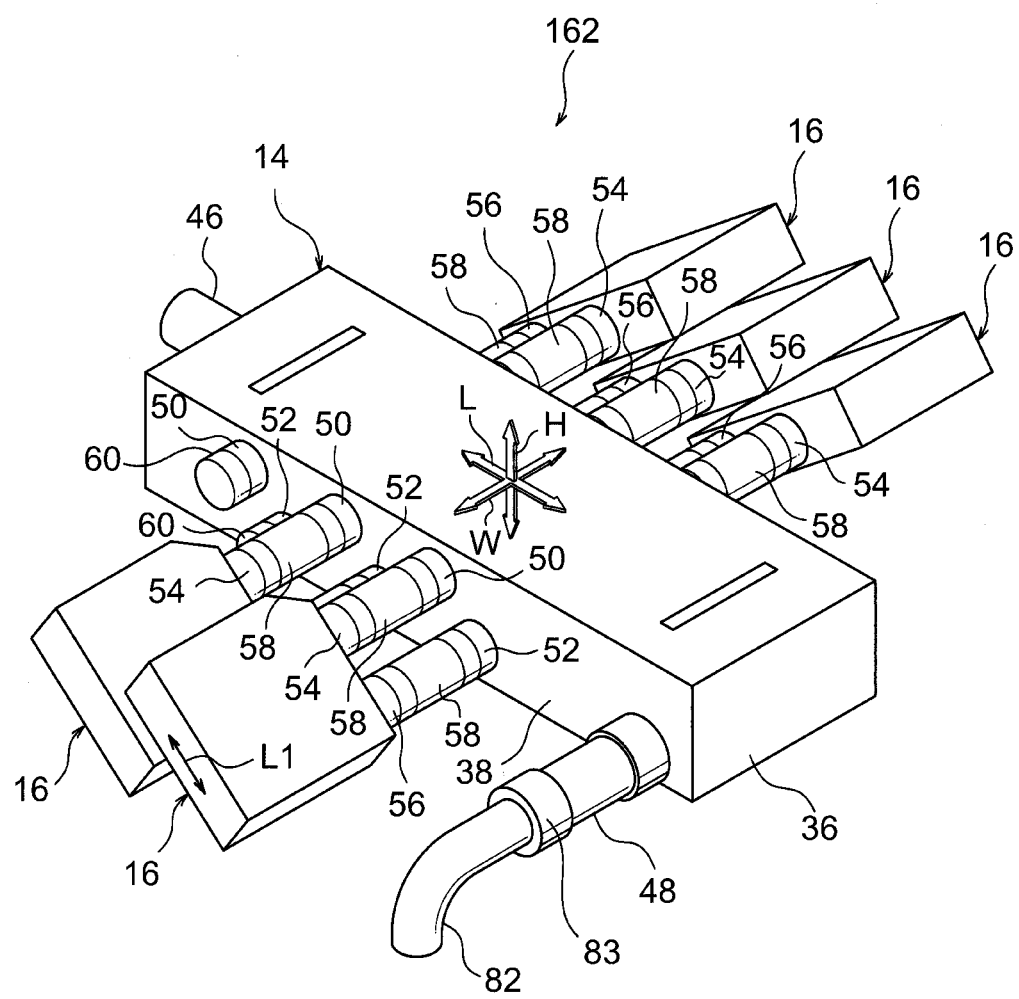
FIG. 21 is a perspective view illustrating a coolant supply unit of a fifth exemplary embodiment.

However, there is no requirement to have the same number of pumps on both width direction sides of the casing 14. For example, as in a coolant supply unit 162 of a fifth exemplary embodiment illustrated in FIG. 21, the number of pumps may differ on the two width direction sides of the casing 14. Note that the coolant supply unit 162 of the fifth exemplary embodiment has a similar structure to the coolant supply unit 12 of the first exemplary embodiment except for in the respect that there are a different number of pumps on either width direction side of the casing 14.

In the second exemplary embodiment to the fourth exemplary embodiment, examples are given wherein plural pumps 16 are only disposed at one width direction side of the casing 124, 134, 154. The width of the coolant supply unit can accordingly be reduced by only disposing the pumps 16 on one width direction side of the casing 124, 134, 154.

There is no requirement to connect pumps 16 to all of the branch ports 42 and flow merging ports 44 even when pumps are only provided on a single width direction side of the casing 14.

When branch ports 42 and flow merging ports 44 to which a pump 16 is not connected are present, leading ends of the pump side connection tubes 50, 52 are closed off with closing off members (see FIG. 21) such as caps 60, to suppress unintentional coolant leakage from inside the casing 14.

Configuration may be made wherein the casing 14 is formed with branch ports 42 and flow merging ports 44 for the maximum anticipated number of pumps 16, and provided with a sufficient number of the pumps 16 to secure the predetermined coolant flow rate. Such a structure enables a common casing 14 regardless of the number of pumps, thereby increasing the versatility.

Each of the exemplary embodiments are provided with the inlet port 30 through which coolant flows into the casing 14 at one end portion side of the casing 14, and the outlet port 32 through which coolant flows out from the casing 14 provided at the other end portion side of the casing 14. It is preferable for the pumps 16 to be provided at locations between the inlet port 30 and the outlet port 32 from the perspective of efficient coolant conveyance. Namely, each of the above exemplary embodiments has a structure capable of securing a greater length in the casing 14 length direction than the effective length for disposing the pumps 16.

The electronic device of embodiments discussed herein is not particularly limited, however examples thereof include electronic devices for which more compact and thinner design are demanded, such as desktop or notebook (portable) computers and servers.

Explanation has been given of exemplary embodiments of technology disclosed herein, however the technology disclosed herein is not limited to the above, and obviously various other modifications other than those described above may be implemented within a range not departing from the spirit of technology disclosed herein.

According to the technology disclosed herein, coolant can be supplied employing plural pumps with a small structure.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

All cited documents, patent applications and technical standards mentioned in the present specification are incorporated by reference in the present specification to the same extent as if the individual cited documents, patent applications and technical standards were specifically and individually incorporated by reference in the present specification.

What is claimed is:

1. A coolant supply unit comprising:
a plurality of pumps;
a casing that includes a coolant inlet port, a plurality of branch ports that respectively convey coolant to the plurality of pumps, a plurality of flow merging ports through which the coolant from the plurality of pumps merges, and a coolant outlet port; and
a separating wall that is provided inside the casing, has a planar shape, is mounted between a pair of opposing side walls in a width direction of the casing, and separates the inside of the casing into a distribution chamber that is in communication with the inlet port and the branch ports, and a flow merging chamber that is in communication with the flow merging ports and the outlet port.

2. The coolant supply unit of claim 1, comprising:
a first enlarged portion with a flow path cross-section area widened in a height direction at a location in the distribution chamber portion where the inlet port is provided; and
a second enlarged portion with a flow path cross-section area widened in a height direction at a location in the flow merging chamber portion where the outlet port is provided.

3. The coolant supply unit of claim 2, wherein the inlet port and the outlet port are provided at the same height from a bottom wall of the casing.

4. The coolant supply unit of claim 1, wherein:
the inlet port is provided at one length direction end side of the casing; and
the outlet port is provided at the other length direction end side of the casing.

5. The coolant supply unit of claim 4, wherein respective length directions of the plurality of pumps intersect with the casing length direction in a side view of the casing.

6. The coolant supply unit of claim 4, wherein respective length directions of the plurality of pumps are parallel to the casing length direction in a side view of the casing.

7. The coolant supply unit of claim 1, wherein:
a number of the plurality of branch ports is greater than a number of pumps of the plurality of pumps, and a number of the plurality of flow merging ports is greater than the number of pumps of the plurality of pumps; and
the coolant supply unit further comprises one or more closing off members that close off branch ports and flow merging ports to which the pumps are not connected.

8. The coolant supply unit of claim 1, wherein the plurality of pumps are provided at the casing at one side in a width direction orthogonal to a casing length direction.

9. The coolant supply unit of claim 1, wherein the plurality of pumps are provided at the casing at both sides in a width direction orthogonal to a casing length direction.

10. A cooling unit comprising:
the coolant supply unit of claim 1;
a heat receiving member that causes heat of a cooling target member to act on coolant supplied from the coolant supply unit;
a cooling member that cools the coolant heated by the heat receiving member; and
a storage member that stores the coolant that has been cooled by the cooling member and that is partway through being conveyed to the coolant supply unit.

11. The cooling unit of claim 10, wherein:
the storage member is disposed such that a storage member length direction is inclined with respect to a cooling member length direction in plan view of the cooling member; and
the casing is disposed parallel to the cooling member in the plan view.

12. The cooling unit of claim 11, wherein at least one of the plurality of pumps is disposed between the cooling member and the casing in the plan view.

13. The cooling unit of claim 10, wherein the heat receiving member is disposed below the casing and facing the casing.

14. An electronic device comprising:
the cooling unit of claim 10; and
a cooling target member that is cooled by heat transmission to the coolant by the heat receiving member of the cooling unit.

* * * * *